US010423519B2

(12) United States Patent
Andrejko et al.

(10) Patent No.: US 10,423,519 B2
(45) Date of Patent: *Sep. 24, 2019

(54) PROACTIVE COGNITIVE ANALYSIS FOR INFERRING TEST CASE DEPENDENCIES

(71) Applicant: International Business Machines Corporation, Armonk, NY (US)

(72) Inventors: Pamela D. Andrejko, Cary, NC (US); Andrew R. Freed, Cary, NC (US); Richard A. Salmon, Apex, NC (US); Charles S. Skinner, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,257

(22) Filed: Dec. 26, 2017

(65) Prior Publication Data

US 2018/0121332 A1    May 3, 2018

Related U.S. Application Data

(63) Continuation of application No. 14/804,494, filed on Jul. 21, 2015, now Pat. No. 10,007,594.

(51) Int. Cl.
*G06F 11/07* (2006.01)
*G06F 17/50* (2006.01)
(Continued)

(52) U.S. Cl.
CPC ...... *G06F 11/3672* (2013.01); *G06F 11/3664* (2013.01); *G06F 11/3668* (2013.01);
(Continued)

(58) Field of Classification Search
CPC ... G06F 8/20; G06F 8/10; G06F 11/36; G06F 11/3664; G06F 11/3684; G06F 11/263;
(Continued)

(56) References Cited

U.S. PATENT DOCUMENTS 6,892,154 B1    5/2005   Lee
7,490,319 B2    2/2009   Blackwell et al.
(Continued)

FOREIGN PATENT DOCUMENTS

WO    WO2005/045673 A2    5/2005

OTHER PUBLICATIONS

Sandra Rapps et al., Selecting Software Test Data Using Data Flow Information, IEEE vol. SE-11 No. 4, Apr. 1985, [Retrieved on May 1, 2019]. Retrieved from the internet: 9 Pages (367-375) (Year: 1985).*

(Continued)

*Primary Examiner* — Anibal Rivera
(74) *Attorney, Agent, or Firm* — Stephen J. Walder, Jr.; Diana R. Gerhardt

(57) ABSTRACT

Mechanisms are provided for evaluating test cases for testing a software product based on a requirements change. The mechanisms analyze a test case corpus to identify a plurality of first relationships between elements of test cases in the test case corpus and generate a test case relationship model based on the identified plurality of first relationships. The mechanisms receive a proposed requirements change to change one or more requirements of the software product and then perform a search of the test case relationship model to identify test case relationships corresponding to the proposed requirements change. The mechanisms identify a subset of test cases affected by the proposed requirements change and generate an output specifying the identified subset of test cases.

20 Claims, 7 Drawing Sheets

(51) Int. Cl.
*G06F 17/30* (2006.01)
*G06F 9/44* (2018.01)
*G06F 11/36* (2006.01)
*G06Q 10/06* (2012.01)
*G06F 8/41* (2018.01)
*G06F 8/10* (2018.01)

(52) U.S. Cl.
CPC ............ *G06F 11/3684* (2013.01); *G06F 8/10* (2013.01); *G06F 8/43* (2013.01); *G06F 17/5081* (2013.01); *G06Q 10/06* (2013.01)

(58) Field of Classification Search
CPC ............ G06F 11/3688; G06F 11/3672; G06F 11/368; G06F 11/3676; G06F 9/454; G06F 17/5081; G06F 17/504; G06F 9/44505; H04H 60/46
See application file for complete search history.

(56) References Cited

U.S. PATENT DOCUMENTS

| | | | |
|---|---|---|---|
| 8,266,592 B2* | 9/2012 | Beto | G06F 11/3688 717/124 |
| 8,645,904 B2 | 2/2014 | Coldicott et al. | |
| 8,813,033 B2 | 8/2014 | Chakravarthy | |
| 8,965,887 B2 | 2/2015 | Iwama et al. | |
| 8,997,052 B2 | 3/2015 | Bhagavatula | |
| 9,002,770 B2 | 4/2015 | Gould | |
| 9,389,986 B2 | 7/2016 | Abraham et al. | |
| 9,519,477 B2 | 12/2016 | Champlin-Scharff et al. | |
| 2002/0066077 A1* | 5/2002 | Leung | G06F 11/368 717/126 |
| 2003/0046029 A1* | 3/2003 | Wiener | G06F 11/3672 702/186 |
| 2004/0073918 A1* | 4/2004 | Ferman | H04H 60/46 725/34 |
| 2005/0144593 A1* | 6/2005 | Raghuvir | G06F 11/3688 717/124 |
| 2005/0166094 A1* | 7/2005 | Blackwell | G06F 11/3664 714/38.14 |
| 2005/0203717 A1* | 9/2005 | Parimi | G06F 11/263 702/188 |
| 2007/0130561 A1* | 6/2007 | Siddaramappa | G06F 8/10 717/106 |
| 2007/0250799 A1* | 10/2007 | Bunin | G06F 17/504 716/106 |
| 2009/0199045 A1* | 8/2009 | Kasubuchi | G06F 11/3684 714/38.1 |
| 2009/0259454 A1 | 10/2009 | Adir et al. | |
| 2009/0287678 A1 | 11/2009 | Brown et al. | |
| 2009/0307763 A1* | 12/2009 | Rawlins | G06F 9/44505 726/5 |
| 2010/0131497 A1* | 5/2010 | Peterson | G06Q 10/06 707/722 |
| 2010/0333073 A1* | 12/2010 | Mills | G06F 8/10 717/131 |
| 2011/0066587 A1 | 3/2011 | Ferrucci et al. | |
| 2011/0125734 A1 | 5/2011 | Duboue et al. | |
| 2011/0145788 A1* | 6/2011 | Xu | G06F 11/368 717/121 |
| 2011/0208469 A1* | 8/2011 | Sheye | G06F 11/3684 702/123 |
| 2011/0246540 A1 | 10/2011 | Salman et al. | |
| 2012/0030658 A1 | 2/2012 | Hu et al. | |
| 2012/0311541 A1 | 12/2012 | Bullard et al. | |
| 2013/0006683 A1* | 1/2013 | Rao | G06Q 10/06 705/7.11 |
| 2013/0007055 A1 | 1/2013 | Brown et al. | |
| 2013/0018652 A1 | 1/2013 | Ferrucci et al. | |
| 2013/0042221 A1 | 2/2013 | Mehalingam | |
| 2013/0066886 A1 | 3/2013 | Bagchi et al. | |
| 2013/0152047 A1 | 6/2013 | Moorthi et al. | |
| 2013/0174178 A1* | 7/2013 | Chakraborty | G06F 11/3672 718/105 |
| 2014/0040867 A1* | 2/2014 | Wefers | G06F 11/3684 717/131 |
| 2014/0164208 A1* | 6/2014 | Mueller | G06Q 10/0639 705/37 |
| 2014/0201712 A1* | 7/2014 | Boden | G06F 11/3684 717/124 |
| 2014/0351793 A1* | 11/2014 | Bartley | G06F 11/3676 717/124 |
| 2014/0380277 A1* | 12/2014 | Bhagavatula | G06F 11/3684 717/124 |
| 2015/0007146 A1 | 1/2015 | Li et al. | |
| 2015/0082277 A1* | 3/2015 | Champlin-Scharff | G06F 9/454 717/120 |
| 2015/0261505 A1* | 9/2015 | Bera | G06F 8/20 717/104 |
| 2015/0378875 A1* | 12/2015 | Sivanesan | G06F 11/3684 717/124 |
| 2015/0379187 A1* | 12/2015 | Gou | G06F 17/5081 716/107 |
| 2016/0055079 A1* | 2/2016 | Hanna | G06F 11/3692 717/135 |
| 2016/0117239 A1* | 4/2016 | Hamilton, II | G06F 11/3684 717/124 |
| 2017/0024310 A1 | 1/2017 | Andrejko et al. | |
| 2017/0024311 A1 | 1/2017 | Andrejko et al. | |

OTHER PUBLICATIONS

Gregg Rothermel et al., Prioritizing Test Cases for Regression Testing, IEEE, vol. 27 No. 10, Oct. 2001, [Retrieved on May 1, 2019]. Retrieved from the internet: 20 Pages (929-948) (Year: 2001).*

"How to Manage Requirements, Execute Test Cases and Generate Reports Using TestLink—Tutorial #2", Testlink, http://www.softwaretestinghelp.com/testlink-tutorial-2/, accessed online Apr. 14, 2015, 20 pages.

"List of IBM Patents or Patent Applications Treated as Related", Jan. 24, 2018, 2 pages.

"Online Test Case Management Tool", TestLodge, accessed online Apr. 14, 2015, 2 pages.

"Which tests should be run since a previous build?", Microsoft, https://msdn.microsoft.com/en-us/library/dd286589.aspx, accessed online Apr. 14, 2015, 2 pages.

Alazzam, Iyad, "Test Cases Selection Based on Source Code Features Extraction", International Journal of Software Engineering and Its Applications, vol. 8, No. 1 (2014), Jan. 2014, pp. 203-214.

Boehm, Barry W., "A Spiral Model of Software Development and Enhancement", IEEE, May 1988, pp. 61-72.

Ghosh, S.M. et al., "Study of Impact Analysis of Software Requirement Change in SAP ERP", International Journal of Advanced Science and Technology, vol. 33, http://www.sersc.org/journals/IJAST/vol33/9.pdf, Aug. 2011, pp. 95-100.

Heindl, Matthias et al., "Requirements Tracing Strategies for Change Impact Analysis and Re-Testing—An Initial Tracing Activity Model and Industry Feasibility Study", Technical Report, http://qse.ifs.tuwien.ac.at/publication/TR070110HeindlTAM.pdf, 2007, 12 pages.

High, Rob, "The Era of Cognitive Systems: An Inside Look at IBM Watson and How it Works", IBM Corporation, Redbooks, Dec. 12, 2012, 16 pages.

Jainae, Jiratchaya et al., "A Framework for Test Case Impact Analysis of Database Schema Changes Using Use Cases", IACSIT International Journal of Engineering and Technology, vol. 6, No. 3, Jun. 2014, pp. 186-189.

Maiden, Neil A. et al., "Acquiring COTS Software Selection Requirements", IEEE, Mar. 1998, pp. 46-56.

Mccord, M.C. et al., "Deep parsing in Watson", IBM J. Res. & Dev. vol. 56 No. 3/4 Paper 3, May/Jul. 2012, pp. 3:1-3:15.

O'Neal, James S., "Analyzing the Impact of Changing Software Requirements: A Traceability-Based Methodology", Dissertation, Louisiana State University and Agricultural and Mechanical Col-

(56) References Cited

OTHER PUBLICATIONS lege, Department of Computer Science, http://etd.lsu.edu/docs/available/etd-0929103-120652/unrestricted/O%27Neal_dis.pdf, Dec. 2003, 104 pages.

Phetmanee, Surasak et al., "A Tool for Impact Analysis of Test Cases Based on Changes of a Web Application", Proceedings of the International MultiConference of Engineers and Computer Scientists (IMECS 2014), Mar. 12-14, 2014, 4 pages.

Qu, Xiao et al., "Impact Analysis of Configuration Changes for Test Case Selection", 2011 IEEE 22nd International Symposium on Software Reliability Engineering (ISSRE), Nov. 29, 2011, 10 pages.

Rapps, Sandra et al., "Selecting Software Test Data Using Data Flow Information", IEEE Transactions on Software Engineering, vol. SE-11, No. 4, Apr. 1985, pp. 367-375.

Rothermel, Gregg et al., "Prioritizing Test Cases for Regression Testing", IEEE Transactions on Software Engineering, vol. 27, No. 10, Oct. 2001, pp. 929-948.

Settimi, Raffaella et al., "Supporting Software Evolution through Dynamically Retrieving Traces to UML Artifacts", IEEE, Proceedings of the 7th International Workshop on Principles of Software Evolution, Sep. 2004, 6 pages.

Tsai, Wei-Tek et al., "A Coverage Relationship Model for Test Case Selection and Ranking for Multi-version Software", Chapter 14, High Assurance Services Computing, May 2009, 27 pages.

Yuan, Michael J., "Watson and healthcare, How natural language processing and semantic search could revolutionize clinical decision support", IBM Corporation, IBM developerWorks, http://www.ibm.com/developerworks/industry/library/ind-watson/, Apr. 12, 2011, 14 pages.

\* cited by examiner

Test Cases >

⊘ Saved successfully at: 20:24:25

\* 4093: Lung Cancer Tumor Lysis Syndrome ← 410
(TLS) Prediction

Sections

Summary

Test Description
Test Case Design
Development Items
Requirement Links
Expected Results State: Draft Priority: ☐ Unassigned ▸

Action: Change State ▸

Owner: Unassigned ▸

Description: The purpose of this test case is to verify a non-Small Cell Lung Cancer (NSCLC) patient with renal problems and elevated Uric acid and Potassium lab results is identified with an intermediate risk of Tumor Lysis Syndrome ← 420

FIG. 4A

| | Description | Expected Results |
|---|---|---|
| 1 | A prediction alert surfaces when<br><br>• [Adult] Patient is > [18 years old]<br>• Diagnosis = [SCLC or NSCLC]<br>• [Uric Acid Lab] > ULN<br>• [Potassium Lab] > ULN<br>• [Phosphate Lab] normal<br>• Active toxic event for kidney failure<br><br>Bring up a patient which meets these criteria<br><br>430 | Verify a [TLS Intermediate Risk Prediction Alert] is present and includes a [highlighted link] to the [lab timeline]<br><br>440 |
| 2 | [Mouse left-click] on the [lab timeline link] on the [Prediction Alert]<br><br>430 | Verify the [timeline graph] is opened and includes the following data:<br><br>• [Uric Acid Lab]<br>• [Potassium Lab]<br>• [Phosphate Lab]<br><br>440 |

FIG. 4B

PROACTIVE COGNITIVE ANALYSIS FOR INFERRING TEST CASE DEPENDENCIES

This application is a continuation of application Ser. No. 14/804,494, filed Jul. 21, 2015, now U.S. Pat. No. 10,007,594.

BACKGROUND

The present application relates generally to an improved data processing apparatus and method and more specifically to mechanisms for performing proactive cognitive analysis for inferring test case dependencies.

With the increased usage of computing networks, such as the Internet, humans are currently inundated and overwhelmed with the amount of information available to them from various structured and unstructured sources. However, information gaps abound as users try to piece together what they can find that they believe to be relevant during searches for information on various subjects. To assist with such searches, recent research has been directed to generating Question and Answer (QA) systems which may take an input question, analyze it, and return results indicative of the most probable answer to the input question. QA systems provide automated mechanisms for searching through large sets of sources of content, e.g., electronic documents, and analyze them with regard to an input question to determine an answer to the question and a confidence measure as to how accurate an answer is for answering the input question.

Examples, of QA systems are Siri® from Apple®, Cortana® from Microsoft®, and question answering pipeline of the IBM Watson™ cognitive system available from International Business Machines (IBM®) Corporation of Armonk, N.Y. The IBM Watson™ system is an application of advanced natural language processing, information retrieval, knowledge representation and reasoning, and machine learning technologies to the field of open domain question answering. The IBM Watson™ system is built on IBM's DeepQA™ technology used for hypothesis generation, massive evidence gathering, analysis, and scoring. DeepQA™ takes an input question, analyzes it, decomposes the question into constituent parts, generates one or more hypothesis based on the decomposed question and results of a primary search of answer sources, performs hypothesis and evidence scoring based on a retrieval of evidence from evidence sources, performs synthesis of the one or more hypothesis, and based on trained models, performs a final merging and ranking to output an answer to the input question along with a confidence measure.

SUMMARY

In one illustrative embodiment, a method is provided, in a data processing system comprising a processor and a memory, for evaluating test cases for testing a software product based on a requirements change. The method comprises analyzing, by the data processing system, a test case corpus to identify a plurality of first relationships between elements of test cases in the test case corpus. The method further comprises generating, by the data processing system, a test case relationship model based on the identified plurality of first relationships. Moreover, the method comprises receiving, by the data processing system, a proposed requirements change to change one or more requirements of the software product and searching, by the data processing system, the test case relationship model to identify test case relationships corresponding to the proposed requirements change. In addition, the method comprises identifying, by the data processing system, a subset of test cases in the test case corpus affected by the proposed requirements change based on the identified test case relationships corresponding to the proposed requirements change. Furthermore, the method comprises generating, by the data processing system, an output specifying the identified subset of test cases.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 4A and 4B are example diagrams of test cases that is evaluated using natural language processing to identify relationships of test case elements in accordance with one illustrative embodiment;

DETAILED DESCRIPTION

Figure 1:
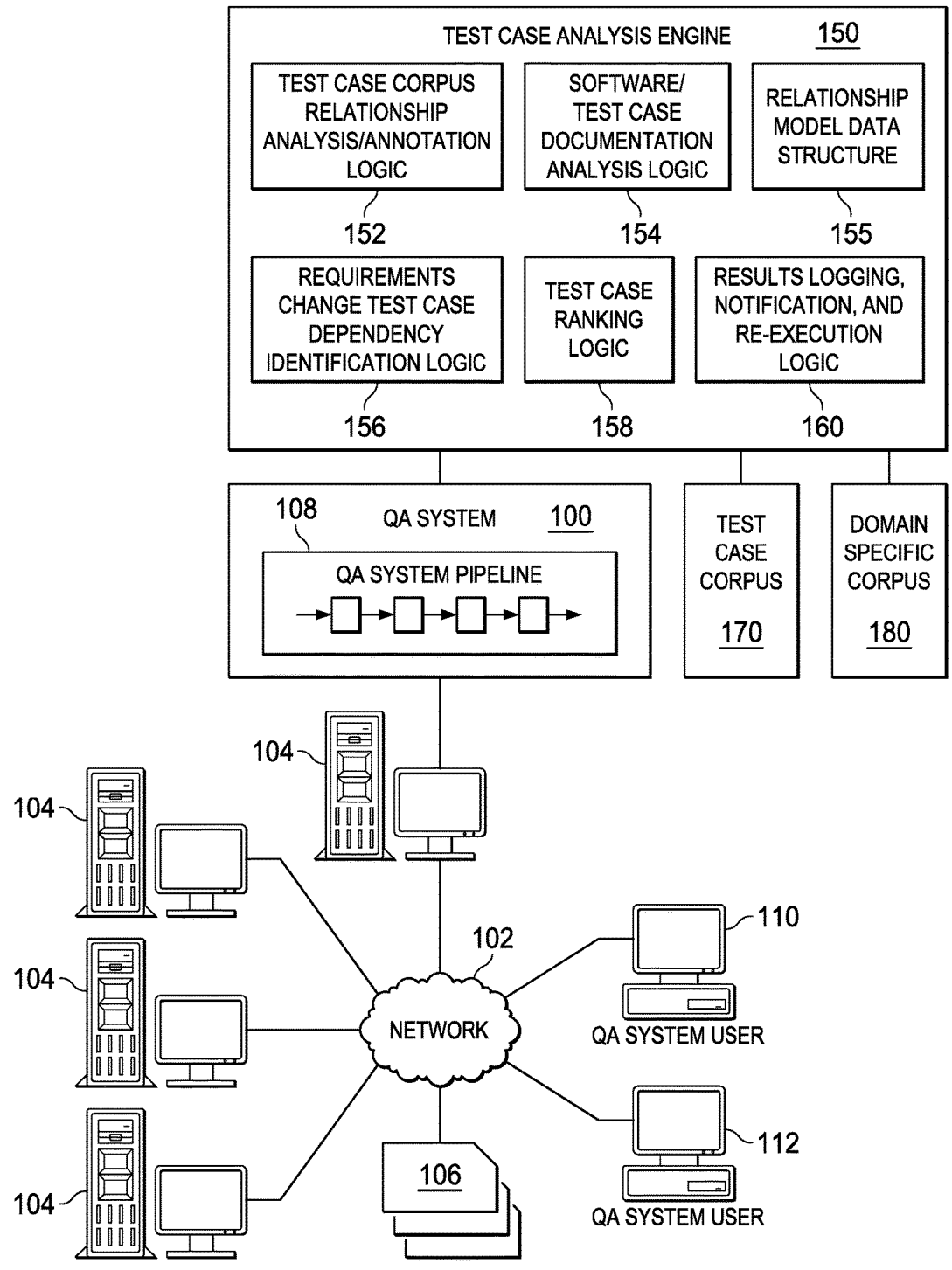
FIG. 1 depicts a schematic diagram of one illustrative embodiment of a cognitive system in a computer network.

The illustrative embodiments provide mechanisms for performing proactive cognitive analysis to infer test case dependencies. In software development, application requirements are always changing and it is important that individuals be able to respond quickly to changing requirements. That is, it is important to be able to infer the ripple effect of the new or changing requirement on the test plan and thus, identify which test cases are affected by the changing requirements, which test cases should be updated, and which test cases should be re-executed once the changes are implemented. Known mechanisms utilize a retro-active approach which analyzes traces of software code after the code has been changed and executed to determine after-the-fact what portions of code are affected by such changes. The proactive cognitive analysis of the illustrative embodiments provides a more timely approach that allows for the ability to detect the impact to test cases of proposed changes without having to wait for the code changes to be implemented. To the contrary, the illustrative embodiments predict which tests need to be re-run/updated/created based on the proposed changes to the code. Moreover, by predicting which tests need to be rerun/updated/created, a developer is given insight into the affect of the proposed changes so that the developer can determine whether the proposed changes may in fact be incorrect prior to implementation of the changes.

The illustrative embodiments utilize natural language processing (NLP) on a test case corpus to thereby annotate the test case attributes such that cognitive analysis can be performed to find direct and indirect relationships between system attributes under test and test cases affected when requirements change. In one illustrative embodiment, these relationships are identified based on analysis of the inputs and outputs of the test cases in the test case corpus. In addition, NLP is performed on a corpus of electronic documents of a domain corresponding to the software under development and/or the test cases for testing the operation of the software under development (SUD), e.g., design documents, requirements documents, the documents describing the software under development, documents describing the test cases and their expected results, or the like.

Thus, the NLP analysis of the test cases themselves in the test case corpus provides actual direct/indirect relationships specified in the test cases based on their inputs/outputs. The NLP analysis of the corpus of documentation provides additional sources of natural language text specifying relationships associated with the test cases and evidence in support of the direct/indirect relationships found in the NLP analysis of the test cases themselves. The relationships identified in this manner are scored based on an evidence search of one or more corpora with relatively higher scores being provided to relationships found through NLP analysis of the test case corpus. As a result, a ranked set of relationships is generated to represent a relationship model of the relationships between elements of the test cases that may be checked when changes to the software code is to be performed.

Thus, when a change to code of a software under development (SUD) is to be performed, the relationships of the test cases may be searched to identify which test cases will be affected by the proposed change to code of the SUD. This search may identify direct relationships between an element, or elements, that are subject to the change with elements of one or more test cases based on the relationship model that was generated. In addition, the search may be performed to identify indirect relationships between the element(s) that are subject to the proposed change and elements of test cases. Test cases with direct/indirect relationships between the element(s) of the proposed change with elements of the test cases may be identified for re-execution of the test cases.

The identification of the test cases for re-execution may be performed based on a ranking of the matching test cases according to their dependency relationships. For example, test cases having direct relationships may be ranked higher than test cases that have only indirect relationships. Test cases having multiple direct relationships may be more highly ranked that test cases having a relatively smaller number of direct relationships. Test cases having both direct relationships and indirect relationships may be ranked higher than test cases only having indirect relationships, and so on. Any suitable manner of scoring the matching test cases, based on the desired implementation, may be used without departing from the spirit or scope of the illustrative embodiments. The resulting ranked listing of affected test cases (matching test cases) may be compared to one or more thresholds to select a subset of the ranked listing for use in re-executing test cases to test the SUD once the proposed change is implemented, e.g., on a percentile scale, all of the affected test cases that have a score equal to or greater than 80%.

In some illustrative embodiments, when performing the above operations to identify test cases affected by the proposed change to the code of the SUD, it is possible that no test cases are identified as having a sufficiently high enough score to warrant re-execution, i.e. a null set of test cases is generated. In such a situation, this lack of identification of a test case for re-execution is indicative of a possible area where a new test case should be generated. In response to the identification of such a situation, a notification may be generated and output to an authorized individual's computing device, or otherwise logged in a log data file for later review and analysis, to inform the authorized individual of the elements affected by the proposed change in the code of the SUD and an indication of the lack of affect on any test cases being indicative of a need for a new test case.

In still further illustrative embodiments, the mechanisms of the illustrative embodiments may identify test cases that are no longer valid and need to be updated based on requirement changes. For example, if a requirement changes in the code of the SUD as a result of the proposed changes and/or previously applied changes, then test cases that are over-specified may be identified and a corresponding notification sent to the authorized individual's computing device, or otherwise logged in a log data file for later review and analysis, to inform the authorized individual of the over-specification of the test case and the need to revise or eliminate the test case due to the test case no longer being valid. For example, if a test case depends on elements A and B, however the proposed change to the code of the SUD or a previously implemented change to the code of the SUD results in the code being dependent upon A only, then the test case is over-specified (i.e. the test case is dependent on A and B when only A really matters anymore) and needs to be eliminated or revised. The notification or log record in the log data file may specify the test cases, the nature of the over-specification, and an indicator of a need to eliminate or revise the test case.

Thus, with the implementation of the illustrative embodiments, a mechanism is provided for identifying test cases that are affected by proposed changes to requirements in the code of a SUD. The identified test cases may then be ranked to determine which are to be re-executed. These identified test cases may then be used to generate notifications to an authorized individual to inform them of a need to re-execute the identified test cases. Alternatively, the identified test cases may be automatically re-executed with the generated test results logged and/or reported to the authorized individual. In addition, situations indicative of a need for new test cases and/or elimination or revising of existing invalid test cases may be identified and logged and/or notified to an authorized individual.

Before beginning the discussion of the various aspects of the illustrative embodiments in more detail, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general purpose hardware, software instructions stored on a medium such that the instructions are readily executable by specialized or general purpose hardware, a procedure or method for executing the functions, or a combination of any of the above.

The present description and claims may make use of the terms "a", "at least one of", and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
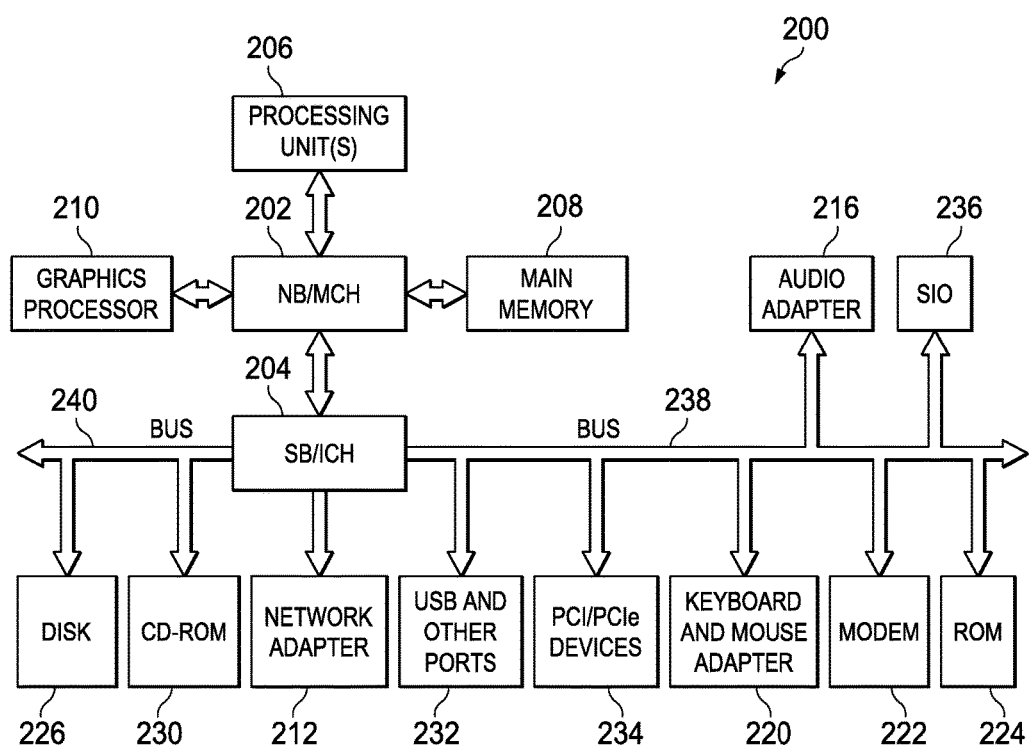
FIG. 2 is a block diagram of an example data processing system in which aspects of the illustrative embodiments are implemented.
Figure 3:
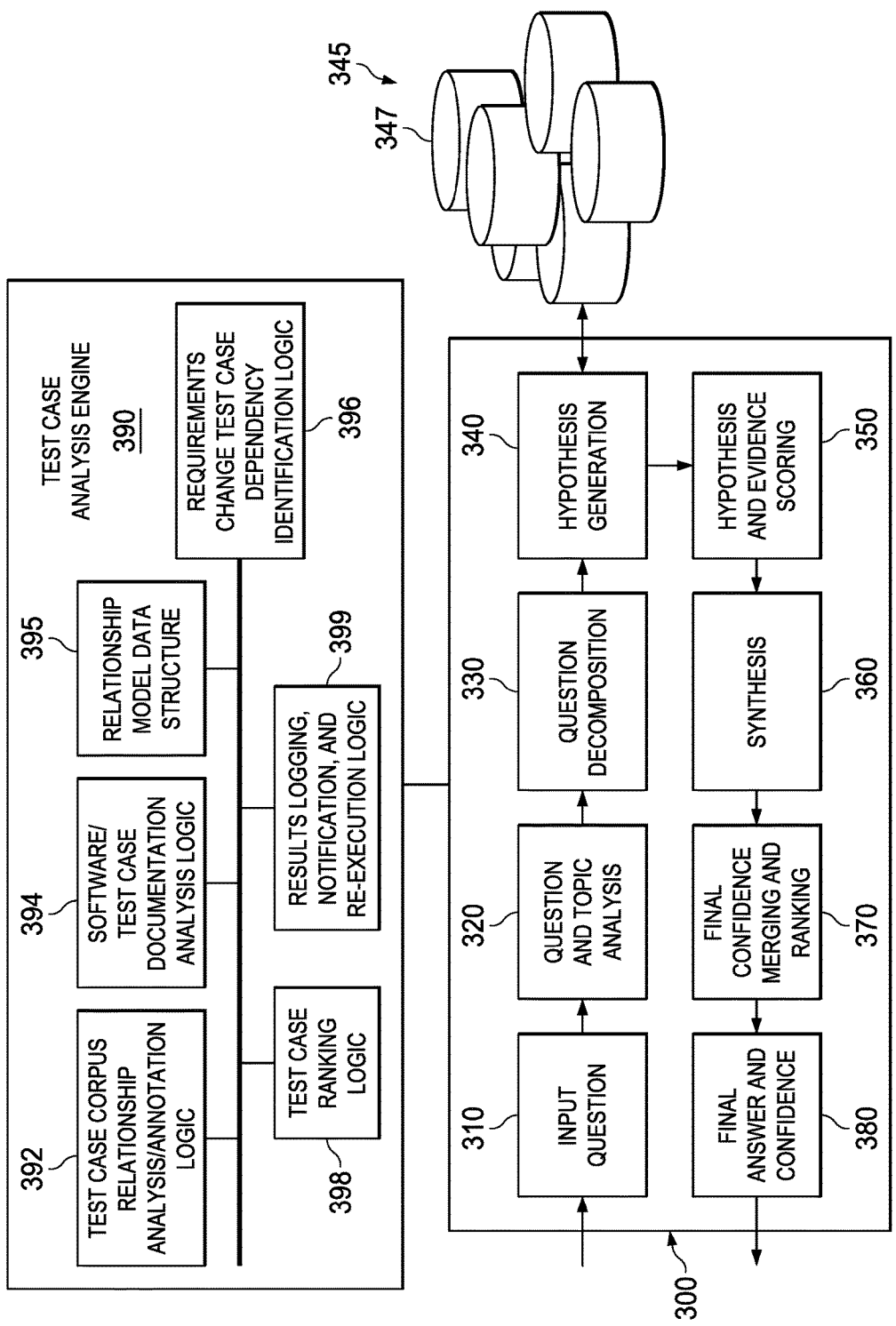
FIG. 3 illustrates a QA system pipeline with which a test case analysis engine may be implemented in accordance with one illustrative embodiment.

The illustrative embodiments may be utilized in many different types of data processing environments. In order to provide a context for the description of the specific elements and functionality of the illustrative embodiments, FIGS. 1-3 are provided hereafter as example environments in which aspects of the illustrative embodiments may be implemented. It should be appreciated that FIGS. 1-3 are only examples and are not intended to assert or imply any limitation with regard to the environments in which aspects or embodiments of the present invention may be implemented. Many modifications to the depicted environments may be made without departing from the spirit and scope of the present invention.

FIGS. 1-3 are directed to describing an example cognitive system implementing a Question Answering (QA) pipeline (also referred to as a Question/Answer pipeline or Question and Answer pipeline), methodology, and computer program product with which the mechanisms of the illustrative embodiments are implemented. As will be discussed in greater detail hereafter, the illustrative embodiments are integrated in, augment, and extend the functionality of these QA mechanisms of the cognitive system with regard to identifying test cases in a test case corpus that are affected by a proposed change of a requirement set forth in code of a software under development (SUD). In this sense, the input question to the QA pipeline is a request to identify which test cases are affected by a particular proposed change to code of a SUD, e.g., "What test cases are affected by proposed code change X?" It should be appreciated that the illustrative embodiments may operate without the explicit input of a natural language question and instead may be any request that identifies a desire to identify and/or re-execute test cases and identifies the potential requirement change that is the basis by which to determine the test cases affected and/or re-execute. In such a case, the NLP analysis, hypothesis generation, scoring and ranking mechanisms, and the like, of a QA pipeline may be modified to perform their functions with regard to a test case corpus to identify those test cases that are affected by the proposed change and which are potentially in need of re-execution. Moreover, these mechanisms may be further augmented to include logic for determining when new test cases need to be generated and/or when test cases are no longer valid in view of the potential change to the requirements of the code of a SUD.

Since the mechanisms of the illustrative embodiments may employ the natural language processing mechanisms of a QA pipeline of a cognitive system, it is important to first have an understanding of how question and answer creation in a cognitive system implementing a QA pipeline is implemented before describing how the mechanisms of the illustrative embodiments are integrated in and augment such QA mechanisms. It should be appreciated that the QA mechanisms described in FIGS. 1-3 are only examples and are not intended to state or imply any limitation with regard to the type of QA mechanisms with which the illustrative embodiments are implemented. Many modifications to the example cognitive system shown in FIGS. 1-3 may be implemented in various embodiments of the present invention without departing from the spirit and scope of the present invention.

As an overview, a cognitive system is a specialized computer system, or set of computer systems, configured with hardware and/or software logic (in combination with hardware logic upon which the software executes) to emulate human cognitive functions. These cognitive systems apply human-like characteristics to conveying and manipulating ideas which, when combined with the inherent strengths of digital computing, can solve problems with high accuracy and resilience on a large scale. A cognitive system performs one or more computer-implemented cognitive operations that approximate a human thought process as well as enable people and machines to interact in a more natural manner so as to extend and magnify human expertise and cognition. A cognitive system comprises artificial intelligence logic, such as natural language processing (NLP) based logic, for example, and machine learning logic, which may be provided as specialized hardware, software executed on hardware, or any combination of specialized hardware and software executed on hardware. The logic of the cognitive system implements the cognitive operation(s), examples of which include, but are not limited to, question answering, identification of related concepts within different portions of content in a corpus, intelligent search algorithms, such as Internet web page searches, for example, medical diagnostic and treatment recommendations, and other types of recommendation generation, e.g., items of interest to a particular user, potential new contact recommendations, or the like.

IBM Watson™ is an example of one such cognitive system which can process human readable language and identify inferences between text passages with human-like high accuracy at speeds far faster than human beings and on a larger scale. In general, such cognitive systems are able to perform the following functions:

- Navigate the complexities of human language and understanding
- Ingest and process vast amounts of structured and unstructured data
- Generate and evaluate hypothesis
- Weigh and evaluate responses that are based only on relevant evidence
- Provide situation-specific advice, insights, and guidance
- Improve knowledge and learn with each iteration and interaction through machine learning processes
- Enable decision making at the point of impact (contextual guidance)
- Scale in proportion to the task
- Extend and magnify human expertise and cognition
- Identify resonating, human-like attributes and traits from natural language
- Deduce various language specific or agnostic attributes from natural language
- High degree of relevant recollection from data points (images, text, voice) (memorization and recall)
- Predict and sense with situational awareness that mimic human cognition based on experiences
- Answer questions based on natural language and specific evidence In one aspect, cognitive systems provide mechanisms for answering questions posed to these cognitive systems using a Question Answering pipeline or system (QA system). The QA pipeline or system is an artificial intelligence application executing on data processing hardware that answers questions pertaining to a given subject-matter domain presented in natural language. The QA pipeline receives inputs from various sources including input over a network, a corpus of electronic documents or other data, data from a content creator, information from one or more content users, and other such inputs from other possible sources of input. Data storage devices store the corpus of data. A content creator creates content in a document for use as part of a corpus of data with the QA pipeline. The document may include any file, text, article, or source of data for use in the QA system. For example, a QA pipeline accesses a body of knowledge about the domain, or subject matter area, e.g., financial domain, medical domain, legal domain, etc., where the body of knowledge (knowledgebase) can be organized in a variety of configurations, e.g., a structured repository of domain-specific information, such as ontologies, or unstructured data related to the domain, or a collection of natural language documents about the domain.

Content users input questions to cognitive system which implements the QA pipeline. The QA pipeline then answers the input questions using the content in the corpus of data by evaluating documents, sections of documents, portions of data in the corpus, or the like. When a process evaluates a given section of a document for semantic content, the process can use a variety of conventions to query such document from the QA pipeline, e.g., sending the query to the QA pipeline as a well-formed question which is then interpreted by the QA pipeline and a response is provided containing one or more answers to the question. Semantic content is content based on the relation between signifiers, such as words, phrases, signs, and symbols, and what they stand for, their denotation, or connotation. In other words, semantic content is content that interprets an expression, such as by using Natural Language Processing.

As will be described in greater detail hereafter, the QA pipeline receives an input question, parses the question to extract the major features of the question, uses the extracted features to formulate queries, and then applies those queries to the corpus of data. Based on the application of the queries to the corpus of data, the QA pipeline generates a set of hypotheses, or candidate answers to the input question, by looking across the corpus of data for portions of the corpus of data that have some potential for containing a valuable response to the input question. The QA pipeline then performs deep analysis on the language of the input question and the language used in each of the portions of the corpus of data found during the application of the queries using a variety of reasoning algorithms. There may be hundreds or even thousands of reasoning algorithms applied, each of which performs different analysis, e.g., comparisons, natural language analysis, lexical analysis, or the like, and generates a score. For example, some reasoning algorithms may look at the matching of terms and synonyms within the language of the input question and the found portions of the corpus of data. Other reasoning algorithms may look at temporal or spatial features in the language, while others may evaluate the source of the portion of the corpus of data and evaluate its veracity.

The scores obtained from the various reasoning algorithms indicate the extent to which the potential response is inferred by the input question based on the specific area of focus of that reasoning algorithm. Each resulting score is then weighted against a statistical model. The statistical model captures how well the reasoning algorithm performed at establishing the inference between two similar passages for a particular domain during the training period of the QA pipeline. The statistical model is used to summarize a level of confidence that the QA pipeline has regarding the evidence that the potential response, i.e. candidate answer, is inferred by the question. This process is repeated for each of the candidate answers until the QA pipeline identifies candidate answers that surface as being significantly stronger than others and thus, generates a final answer, or ranked set of answers, for the input question.

As mentioned above, QA pipeline and mechanisms operate by accessing information from a corpus of data or information (also referred to as a corpus of content), analyzing it, and then generating answer results based on the analysis of this data. Accessing information from a corpus of data typically includes: a database query that answers questions about what is in a collection of structured records, and a search that delivers a collection of document links in response to a query against a collection of unstructured data (text, markup language, etc.). Conventional question answering systems are capable of generating answers based on the corpus of data and the input question, verifying answers to a collection of questions for the corpus of data, correcting errors in digital text using a corpus of data, and selecting answers to questions from a pool of potential answers, i.e. candidate answers.

Content creators, such as article authors, electronic document creators, web page authors, document database creators, and the like, determine use cases for products, solutions, and services described in such content before writing their content. Consequently, the content creators know what questions the content is intended to answer in a particular topic addressed by the content. Categorizing the questions, such as in terms of roles, type of information, tasks, or the like, associated with the question, in each document of a corpus of data allows the QA pipeline to more quickly and efficiently identify documents containing content related to a specific query. The content may also answer other questions that the content creator did not contemplate that may be useful to content users. The questions and answers may be verified by the content creator to be contained in the content for a given document. These capabilities contribute to improved accuracy, system performance, machine learning, and confidence of the QA pipeline. Content creators, automated tools, or the like, annotate or otherwise generate metadata for providing information useable by the QA pipeline to identify these question and answer attributes of the content.

Operating on such content, the QA pipeline generates answers for input questions using a plurality of intensive analysis mechanisms which evaluate the content to identify the most probable answers, i.e. candidate answers, for the input question. The most probable answers are output as a ranked listing of candidate answers ranked according to their relative scores or confidence measures calculated during evaluation of the candidate answers, as a single final answer having a highest ranking score or confidence measure, or which is a best match to the input question, or a combination of ranked listing and final answer.

FIG. 1 depicts a schematic diagram of one illustrative embodiment of a cognitive system 100 implementing a question answering (QA) pipeline 108 in a computer network 102. One example of a question/answer generation operation which may be used in conjunction with the principles described herein is described in U.S. Patent Application Publication No. 2011/0125734, which is herein incorporated by reference in its entirety. The cognitive system 100 is implemented on one or more computing devices 104 (comprising one or more processors and one or more memories, and potentially any other computing device elements generally known in the art including buses, storage devices, communication interfaces, and the like) connected to the computer network 102. The network 102 includes multiple computing devices 104 in communication with each other and with other devices or components via one or more wired and/or wireless data communication links, where each communication link comprises one or more of wires, routers, switches, transmitters, receivers, or the like. The cognitive system 100 and network 102 enables question/answer (QA) generation functionality for one or more cognitive system users via their respective computing devices 110-112. Other embodiments of the cognitive system 100 may be used with components, systems, subsystems, and/or devices other than those that are depicted herein.

The cognitive system 100 is configured to implement a QA pipeline 108 that receive inputs from various sources. For example, the cognitive system 100 receives input from the network 102, a corpus of electronic documents 106, cognitive system users, and/or other data and other possible sources of input. In one embodiment, some or all of the inputs to the cognitive system 100 are routed through the network 102. The various computing devices 104 on the network 102 include access points for content creators and QA system users. Some of the computing devices 104 include devices for a database storing the corpus of data 106 (which is shown as a separate entity in FIG. 1 for illustrative purposes only). Portions of the corpus of data 106 may also be provided on one or more other network attached storage devices, in one or more databases, or other computing devices not explicitly shown in FIG. 1. The network 102 includes local network connections and remote connections in various embodiments, such that the cognitive system 100 may operate in environments of any size, including local and global, e.g., the Internet.

In one embodiment, the content creator creates content in a document of the corpus of data 106 for use as part of a corpus of data with the cognitive system 100. The document includes any file, text, article, or source of data for use in the cognitive system 100. QA system users access the cognitive system 100 via a network connection or an Internet connection to the network 102, and input questions to the cognitive system 100 that are answered by the content in the corpus of data 106. In one embodiment, the questions are formed using natural language. The cognitive system 100 parses and interprets the question via a QA pipeline 108, and provides a response to the cognitive system user, e.g., cognitive system user 110, containing one or more answers to the question. In some embodiments, the cognitive system 100 provides a response to users in a ranked list of candidate answers while in other illustrative embodiments, the cognitive system 100 provides a single final answer or a combination of a final answer and ranked listing of other candidate answers.

The cognitive system 100 implements the QA pipeline 108 which comprises a plurality of stages for processing an input question and the corpus of data 106. The QA pipeline 108 generates answers for the input question based on the processing of the input question and the corpus of data 106. The QA pipeline 108 will be described in greater detail hereafter with regard to FIG. 3.

In some illustrative embodiments, the cognitive system 100 may be the IBM Watson™ cognitive system available from International Business Machines Corporation of Armonk, N.Y., which is augmented with the mechanisms of the illustrative embodiments described hereafter. As outlined previously, a QA pipeline of the IBM Watson™ cognitive system receives an input question which it then parses to extract the major features of the question, which in turn are then used to formulate queries that are applied to the corpus of data. Based on the application of the queries to the corpus of data, a set of hypotheses, or candidate answers to the input question, are generated by looking across the corpus of data for portions of the corpus of data that have some potential for containing a valuable response to the input question. The QA pipeline of the IBM Watson™ cognitive system then performs deep analysis on the language of the input question and the language used in each of the portions of the corpus of data found during the application of the queries using a variety of reasoning algorithms. The scores obtained from the various reasoning algorithms are then weighted against a statistical model that summarizes a level of confidence that the QA pipeline of the IBM Watson™ cognitive system has regarding the evidence that the potential response, i.e. candidate answer, is inferred by the question. This process is be repeated for each of the candidate answers to generate ranked listing of candidate answers which may then be presented to the user that submitted the input question, or from which a final answer is selected and presented to the user. More information about the QA pipeline of the IBM Watson™ cognitive system may be obtained, for example, from the IBM Corporation website, IBM Redbooks, and the like. For example, information about the QA pipeline of the IBM Watson™ cognitive system can be found in Yuan et al., "Watson and Healthcare," IBM developerWorks, 2011 and "The Era of Cognitive Systems: An Inside Look at IBM Watson and How it Works" by Rob High, IBM Redbooks, 2012.

As shown in FIG. 1, the cognitive system 100 is further augmented, in accordance with the mechanisms of the illustrative embodiments, to include logic implemented in specialized hardware, software executed on hardware, or any combination of specialized hardware and software executed on hardware, for implementing a proactive cognitive analysis for inferring test case dependencies on potential changes to requirements in code of a software under development (SUD). This logic is shown in FIG. 1 as test case analysis engine 150 which is depicted as separate logic from the QA pipeline 108 in the cognitive system 100 for purposes of illustration. It should be appreciated that the test case analysis engine 150, or elements of the test case analysis engine 150, may be integrated in logic of the QA pipeline 108, for example.

As shown in FIG. 1, the test case analysis engine 150 may comprise test case corpus relationship analysis/annotation logic 152, software/test case documentation analysis logic 154, relationship model data structure 155 (stored in a storage device, memory, or the like), requirements change test case dependency identification logic 156, test case ranking logic 158, and results logging, notification, and re-execution logic 160. These mechanisms of the test case analysis engine 150 may utilize and/or work in conjunction with the logic of the QA pipeline 108 which provide the natural language processing (NLP) mechanisms, candidate answer/hypothesis generation logic, evidence valuation and scoring logic, ranking logic, and the like, to facilitate the operations of the test case analysis engine 150.

As mentioned above, the mechanisms of the test case analysis engine 150 utilize natural language processing (NLP) on a test case corpus, such as a test case corpus 170, to thereby annotate, by the test case corpus relationship analysis/annotation logic 152, the test case attributes such that cognitive analysis can be performed to find direct and indirect relationships between system attributes under test and test cases affected when requirements change in the software under development (SUD). In one illustrative embodiment, these relationships are identified based on analysis of the inputs and outputs of the test cases in the test case corpus. In addition, NLP is performed by the software/test case documentation analysis logic 154 on a corpus 180 of electronic documents of a domain corresponding to the software under development and/or the test cases for testing the operation of the software under development (SUD), e.g., design documents, requirements documents, the documents describing the software under development, documents describing the test cases and their expected results, or the like.

Based on the relationships identified by the logic 152-154, a test case relationship model data structure 155 is generated that indicates the direct and indirect relationships between elements of the test cases in the test case corpus 170. Thus, for example, if a test case indicates that there is a relationship between an element of a "Tumor Lysis Syndrome (TLS) Prediction" test case "lung cancer" (a test case input) and "prediction" (a test case output), then this direct relationship may be specified in the test case relationship model data structure. Similarly, indirect relationships may also be specified in the test case relationship model data structure, e.g., if element A is related to element B, which in turn is related to element C, then there is an indirect relationship between element A and element C.

The test case relationship model data structure 155 provides the basis for identifying which proposed requirements changes affect the various test cases of the test case corpus 170. A "requirements" change is a change to the operation of a software product, such as a software under development (SUD), that affects the requirements for particular operations to be performed by the software product. For example, if the software product has code that essentially states "if element A and element B, then do X," then the "requirements" for operation X are elements A and B. A change to these requirements may be of the type that the code now states "if element A, then do X" such that the operation X is no longer dependent upon the requirement of element B. Other types of requirements changes or greater, the same, or less complexity may be implemented as well, with this being just one simple example.

The requirements change test case dependency identification logic 156, given a proposed requirements change to a software product (considered a SUD for purposes of illustration herein), searches the relationships of the test cases to identify which test cases will be affected by the proposed requirements change in the code of the SUD. This search may identify direct relationships between an element, or elements, that are subject to the requirements change, with elements of one or more test cases based on the test case relationship model data structure 155 that was generated. In addition, the search may be performed to identify indirect relationships between the element(s) that are subject to the proposed requirements change and elements of test cases. Test cases with direct/indirect relationships between the element(s) of the proposed change with elements of the test cases may be identified for re-execution of the test cases.

The identification of the test cases for re-execution by the test case dependency identification logic 156 may be performed based on a ranking of the matching test cases according to their dependency relationships, as determined by the test case ranking logic 158. For example, test cases having direct relationships may be ranked by the test case ranking logic 158 higher than test cases that have only indirect relationships. Test cases having multiple direct relationships may be more highly ranked by the test case ranking logic 158 than test cases having a relatively smaller number of direct relationships, etc. as discussed previously. The resulting ranked listing of affected test cases (matching test cases) be compared by the test case ranking logic 158 to one or more thresholds to select a subset of the ranked listing for use in re-executing test cases to test the SUD once the proposed requirements change is implemented, e.g., on a percentile scale, all of the affected test cases that have a score equal to or greater than 80%. The thresholds may be set so as to identify the test cases of most importance to the particular implementation for verifying proper operation of the SUD and thus, the values of the thresholds may vary from one implementation to another.

Based on the subset of the ranked listing identified by the test case ranking logic 158, the subset of test cases may be logged in a log data structure (not shown) by the results logging, notification, and re-execution logic 160 for later analysis or use by an authorize individual. In some illustrative embodiments, testing logic may be automatically invoked to re-execute the subset of test cases after the proposed requirements change has been implemented. In still other cases, a notification of the subset of test cases may be generated and output to a computing device of an authorized individual for evaluation as to whether to re-execute the test cases. A graphical user interface or other mechanism for interaction by an authorized individual may be provided so that the authorized individual may select which test cases are to be re-executed and may re-initiate the execution of these test cases so as to test the operation of the SUD after the requirements change has been implemented.

This user interface may be provided via the authorized individual's client computing device in response to receiving the notification, in response to the authorized individual accessing the log data structure to review the identified subset of test cases, or the like.

As discussed above, in some illustrative embodiments, the test case dependency identification logic 156 and/or test case ranking logic 158, when performing the above operations to identify test cases affected by the proposed requirements change to the code of the SUD, may determine that no test cases are identified as having a sufficiently high enough score to warrant re-execution. In such a situation, this lack of identification of a test case for re-execution is indicative of a possible area where a new test case should be generated. In response to the identification of such a situation, a notification may be generated and output to an authorized individual's computing device, or the need for a new test case may otherwise be logged in a log data file for later review and analysis, so as to inform the authorized individual of the elements affected by the proposed requirements change in the code of the SUD and an indication of the lack of affect on any currently existing test cases, with this being indicative of a need for a new test case.

In still further illustrative embodiments, the mechanisms of the illustrative embodiments, such as the test case dependency identification logic 156, may identify test cases that are no longer valid and need to be updated based on requirement changes. For example, if a requirement changes in the code of the SUD as a result of the proposed requirements changes and/or previously applied changes, then test cases that are over-specified may be identified by the test case dependency identification logic 156 and a corresponding notification sent to the authorized individual's computing device, or otherwise logged in a log data file for later review and analysis, to inform the authorized individual of the over-specification of the test case and the need to revise or eliminate the test case due to the test case no longer being valid. For example, if a test case depends on elements A and B, however the proposed change to the code of the SUD or a previously implemented change to the code of the SUD results in the code being dependent upon A only, then the test case is over-specified (i.e. the test case is dependent on A and B when only A really matters anymore) and needs to be eliminated or revised. The notification or log record in the log data file may specify the test cases, the nature of the over-specification, and an indicator of a need to eliminate or revise the test case. The identification of the over-specification may comprise the test case dependency identification logic 156 identifying a test case that is dependent upon one of the elements subject to the proposed requirements change, and yet is further dependent upon other elements not subject to the proposed requirements change. As such, these test cases may be identified as potentially over-specified.

The resulting notifications may be transmitted to a client computing device, such as client 110, to notify the authorized individual of the affects of a proposed requirements change on the test cases. Moreover, in some illustrative embodiments, the identification of the subset of test cases may be sent to a test system 180 for automatic re-execute of test cases in the test case corpus 170 corresponding to the identified subset of test cases. In this way, the affects of the proposed requirements change may be determined a priori in a proactive manner using natural language processing (NLP) mechanisms before the proposed requirements change is made and the effects on test cases determined prior to implementation of the requirements change. Moreover, an automatic re-execution of affected test cases may be implemented in response to the proposed requirements changes being implemented without having to perform a retro-active determination of which test cases to run using trace analysis.

FIG. 2 is a block diagram of an example data processing system in which aspects of the illustrative embodiments are implemented. Data processing system 200 is an example of a computer, such as server 104 or client 110 in FIG. 1, in which computer usable code or instructions implementing the processes for illustrative embodiments of the present invention are located. In one illustrative embodiment, FIG. 2 represents a server computing device, such as a server 104, which, which implements a cognitive system 100 and QA system pipeline 108 augmented to include the additional mechanisms of the illustrative embodiments described hereafter.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 is connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 is connected to SB/ICH 204.

An operating system runs on processing unit 206. The operating system coordinates and provides control of various components within the data processing system 200 in FIG. 2. As a client, the operating system is a commercially available operating system such as Microsoft® Windows 8®. An object-oriented programming system, such as the Java™ programming system, may run in conjunction with the operating system and provides calls to the operating system from Java™ programs or applications executing on data processing system 200.

As a server, data processing system 200 may be, for example, an IBM® eServer™ System P® computer system, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and are loaded into main memory 208 for execution by processing unit 206. The processes for illustrative embodiments of the present invention are performed by processing unit 206 using computer usable program code, which is located in a memory such as, for example, main memory 208, ROM 224, or in one or more peripheral devices 226 and 230, for example.

A bus system, such as bus 238 or bus 240 as shown in FIG. 2, is comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, includes one or more devices used to transmit and receive data. A memory may be, for example, main memory 208, ROM 224, or a cache such as found in NB/MCH 202 in FIG. 2.

Those of ordinary skill in the art will appreciate that the hardware depicted in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

FIG. 3 illustrates a QA system pipeline, of a cognitive system, for processing an input question in accordance with one illustrative embodiment. The QA system pipeline of FIG. 3 may be implemented, for example, as QA pipeline 108 of cognitive system 100 in FIG. 1. It should be appreciated that the stages of the QA pipeline shown in FIG. 3 are implemented as one or more software engines, components, or the like, which are configured with logic for implementing the functionality attributed to the particular stage. Each stage is implemented using one or more of such software engines, components or the like. The software engines, components, etc. are executed on one or more processors of one or more data processing systems or devices and utilize or operate on data stored in one or more data storage devices, memories, or the like, on one or more of the data processing systems. The QA pipeline of FIG. 3 is augmented, for example, in one or more of the stages to implement the improved mechanism of the illustrative embodiments described hereafter, additional stages may be provided to implement the improved mechanism, or separate logic from the pipeline 300 may be provided for interfacing with the pipeline 300 and implementing the improved functionality and operations of the illustrative embodiments.

As shown in FIG. 3, the QA pipeline 300 comprises a plurality of stages 310-380 through which the cognitive system operates to analyze an input question and generate a final response. In an initial question input stage 310, the QA pipeline 300 receives an input question that is presented in a natural language format. That is, a user inputs, via a user interface, an input question for which the user wishes to obtain an answer, e.g., "Who are Washington's closest advisors?" In response to receiving the input question, the next stage of the QA pipeline 300, i.e. the question and topic analysis stage 320, parses the input question using natural language processing (NLP) techniques to extract major features from the input question, and classify the major features according to types, e.g., names, dates, or any of a plethora of other defined topics. For example, in the example question above, the term "who" may be associated with a topic for "persons" indicating that the identity of a person is being sought, "Washington" may be identified as a proper name of a person with which the question is associated, "closest" may be identified as a word indicative of proximity or relationship, and "advisors" may be indicative of a noun or other language topic.

In addition, the extracted major features include key words and phrases classified into question characteristics, such as the focus of the question, the lexical answer type (LAT) of the question, and the like. As referred to herein, a lexical answer type (LAT) is a word in, or a word inferred from, the input question that indicates the type of the answer, independent of assigning semantics to that word. For example, in the question "What maneuver was invented in the 1500s to speed up the game and involves two pieces of the same color?," the LAT is the string "maneuver." The focus of a question is the part of the question that, if replaced by the answer, makes the question a standalone statement. For example, in the question "What drug has been shown to relieve the symptoms of ADD with relatively few side effects?," the focus is "drug" since if this word were replaced with the answer, e.g., the answer "Adderall" can be used to replace the term "drug" to generate the sentence "Adderall has been shown to relieve the symptoms of ADD with relatively few side effects." The focus often, but not always, contains the LAT. On the other hand, in many cases it is not possible to infer a meaningful LAT from the focus.

Referring again to FIG. 3, the identified major features are then used during the question decomposition stage 330 to decompose the question into one or more queries that are applied to the corpora of data/information 345 in order to generate one or more hypotheses. The queries are generated in any known or later developed query language, such as the Structure Query Language (SQL), or the like. The queries are applied to one or more databases storing information about the electronic texts, documents, articles, websites, and the like, that make up the corpora of data/information 345. That is, these various sources themselves, different collections of sources, and the like, represent a different corpus 347 within the corpora 345. There may be different corpora 347 defined for different collections of documents based on various criteria depending upon the particular implementation. For example, different corpora may be established for different topics, subject matter categories, sources of information, or the like. As one example, a first corpus may be associated with healthcare documents while a second corpus may be associated with financial documents. Alternatively, one corpus may be documents published by the U.S. Department of Energy while another corpus may be IBM Redbooks documents. Any collection of content having some similar attribute may be considered to be a corpus 347 within the corpora 345.

The queries are applied to one or more databases storing information about the electronic texts, documents, articles, websites, and the like, that make up the corpus of data/information, e.g., the corpus of data 106 in FIG. 1. The queries are applied to the corpus of data/information at the hypothesis generation stage 340 to generate results identifying potential hypotheses for answering the input question, which can then be evaluated. That is, the application of the queries results in the extraction of portions of the corpus of data/information matching the criteria of the particular query. These portions of the corpus are then analyzed and used, during the hypothesis generation stage 340, to generate hypotheses for answering the input question. These hypotheses are also referred to herein as "candidate answers" for the input question. For any input question, at this stage 340, there may be hundreds of hypotheses or candidate answers generated that may need to be evaluated.

The QA pipeline 300, in stage 350, then performs a deep analysis and comparison of the language of the input question and the language of each hypothesis or "candidate answer," as well as performs evidence scoring to evaluate the likelihood that the particular hypothesis is a correct answer for the input question. As mentioned above, this involves using a plurality of reasoning algorithms, each performing a separate type of analysis of the language of the input question and/or content of the corpus that provides evidence in support of, or not in support of, the hypothesis. Each reasoning algorithm generates a score based on the analysis it performs which indicates a measure of relevance of the individual portions of the corpus of data/information extracted by application of the queries as well as a measure of the correctness of the corresponding hypothesis, i.e. a measure of confidence in the hypothesis. There are various ways of generating such scores depending upon the particular analysis being performed. In generally, however, these algorithms look for particular terms, phrases, or patterns of text that are indicative of terms, phrases, or patterns of interest and determine a degree of matching with higher degrees of matching being given relatively higher scores than lower degrees of matching.

Thus, for example, an algorithm may be configured to look for the exact term from an input question or synonyms to that term in the input question, e.g., the exact term or synonyms for the term "movie," and generate a score based on a frequency of use of these exact terms or synonyms. In such a case, exact matches will be given the highest scores, while synonyms may be given lower scores based on a relative ranking of the synonyms as may be specified by a subject matter expert (person with knowledge of the particular domain and terminology used) or automatically determined from frequency of use of the synonym in the corpus corresponding to the domain. Thus, for example, an exact match of the term "movie" in content of the corpus (also referred to as evidence, or evidence passages) is given a highest score. A synonym of movie, such as "motion picture" may be given a lower score but still higher than a synonym of the type "film" or "moving picture show." Instances of the exact matches and synonyms for each evidence passage may be compiled and used in a quantitative function to generate a score for the degree of matching of the evidence passage to the input question.

Thus, for example, a hypothesis or candidate answer to the input question of "What was the first movie?" is "The Horse in Motion." If the evidence passage contains the statements "The first motion picture ever made was 'The Horse in Motion' in 1878 by Eadweard Muybridge. It was a movie of a horse running," and the algorithm is looking for exact matches or synonyms to the focus of the input question, i.e. "movie," then an exact match of "movie" is found in the second sentence of the evidence passage and a highly scored synonym to "movie," i.e. "motion picture," is found in the first sentence of the evidence passage. This may be combined with further analysis of the evidence passage to identify that the text of the candidate answer is present in the evidence passage as well, i.e. "The Horse in Motion." These factors may be combined to give this evidence passage a relatively high score as supporting evidence for the candidate answer "The Horse in Motion" being a correct answer.

It should be appreciated that this is just one simple example of how scoring can be performed. Many other algorithms of various complexity may be used to generate scores for candidate answers and evidence without departing from the spirit and scope of the present invention.

In the synthesis stage 360, the large number of scores generated by the various reasoning algorithms are synthesized into confidence scores or confidence measures for the various hypotheses. This process involves applying weights to the various scores, where the weights have been determined through training of the statistical model employed by the QA pipeline 300 and/or dynamically updated. For example, the weights for scores generated by algorithms that identify exactly matching terms and synonym may be set relatively higher than other algorithms that are evaluating publication dates for evidence passages. The weights themselves may be specified by subject matter experts or learned through machine learning processes that evaluate the significance of characteristics evidence passages and their relative importance to overall candidate answer generation.

The weighted scores are processed in accordance with a statistical model generated through training of the QA pipeline 300 that identifies a manner by which these scores may be combined to generate a confidence score or measure for the individual hypotheses or candidate answers. This confidence score or measure summarizes the level of confidence that the QA pipeline 300 has about the evidence that the candidate answer is inferred by the input question, i.e. that the candidate answer is the correct answer for the input question.

The resulting confidence scores or measures are processed by a final confidence merging and ranking stage 370 which compares the confidence scores and measures to each other, compares them against predetermined thresholds, or performs any other analysis on the confidence scores to determine which hypotheses/candidate answers are the most likely to be the correct answer to the input question. The hypotheses/candidate answers are ranked according to these comparisons to generate a ranked listing of hypotheses/candidate answers (hereafter simply referred to as "candidate answers"). From the ranked listing of candidate answers, at stage 380, a final answer and confidence score, or final set of candidate answers and confidence scores, are generated and output to the submitter of the original input question via a graphical user interface or other mechanism for outputting information.

As shown in FIG. 3, in accordance with one illustrative embodiment, the QA pipeline 300 may operate in conjunction with a test case analysis engine 390 that performs analysis of test cases in a test case corpus to identify which test cases are affected by a proposed requirements change to a software product or SUD. The test case analysis engine 390 may invoke or otherwise employ the logic of one or more of the stages 310-380 of the QA pipeline 300 to perform operations for analyzing test cases, analyzing domain specific documents in a domain specific corpus, and analyzing other sources of evidence using natural language processing (NLP) techniques to identify relationships between elements of test cases and elements associated with requirements in the software product or SUD. Thus, the mechanisms for extracting features of input question 310, such as in stages 320 and/or 330 in the QA pipeline 300, may be employed to extract features of an input specifying the proposed requirements change to thereby identify the elements of the requirements that will be affected by the proposed requirements change. The logic of the hypothesis generation stage 340 may be configured and utilized with the mechanisms of the test case analysis engine 390 to generate a listing of test cases from a test case corpus, such as corpus 347, that have elements matching one or more elements specified in the extracted features of the input. The logic of the hypothesis and evidence scoring 350 may be configured and utilized in conjunction with the test case analysis engine 390 to score each of the test cases identified using the hypothesis generation stage 340 logic to generate a ranked listing of affected test cases that are affected by the proposed requirements change specified in the input.

The synthesis stage 360 logic and final confidence merging and ranking stage 370 logic may be configured and utilized in conjunction with the test case analysis engine 390 to evaluate the ranked listing of affected test cases against one or more thresholds and determine a final subset of the ranked listing to consider for re-execution and/or notification of potential re-execution of the test cases to an authorized individual. Moreover, additional functionality as discussed previously with regard to identifying areas where new test cases may need to be generated and where there are over-specified test cases may be implemented using logic from one or more of the stages 310-380 of the QA pipeline 300. The final answer and confidence stage 380 may provide logic for assisting with the generation and output of log data structures, notifications, and/or instructions for re-execution of test cases on a software product that has had its requirements modified in accordance with the proposed requirements change.

As shown in FIG. 3, the test case analysis engine 390 may comprise test case corpus relationship analysis/annotation logic 392, software/test case documentation analysis logic 394, relationship model data structure 395 (stored in a storage device, memory, or the like), requirements change test case dependency identification logic 396, test case ranking logic 398, and results logging, notification, and re-execution logic 399. This logic corresponds to the similar logic elements described previously above with regard to FIG. 1, e.g., elements 152-160. While shown separate in FIG. 3, portions of this logic 392-399 may be integrated with or otherwise interface with logic of corresponding stages 310-380 of the QA pipeline 300 so as to leverage the natural language processing (NLP) mechanisms, hypothesis generation, evidence scoring and hypothesis scoring, and ranking functionality of the QA pipeline 300.

The test cases and domain specific documentation, e.g., design documents, software descriptions, etc., may be provided as part of a corpus in the corpora 345 and may be operated on by the test case analysis engine 390 to generate the relationship model data structure 395 by identifying the direct and indirect relationships in test cases using the logic 392 and 394 as discussed previously. The relationship model 395 may then be used by the requirements change test case dependency identification logic 396 to identify test cases that are affected by the proposed requirements change specified in the input as identified through feature extraction. The resulting listing of test cases may be ranked according to scoring logic of the test case ranking logic 398 and compared to one or more thresholds to identify a subset of affected test cases for consideration for re-execution. The results may then be logged or used as a basis for generating notifications and/or automatic re-execution of test cases.

As noted above, one of the initial operations performed by the mechanisms of the illustrative embodiments is to generate a relationship model that models the relationships between elements of test cases as determined from analysis of the input/output of the test cases as well as relationships specified in natural language content of documents that describe the test cases. These relationships are then used to generate a relationship model which can be searched based on an input specifying a requirement of the software product that is potentially going to be changed, to thereby identify test cases affected by the potential change.

FIGS. 4A and 4B are example diagrams of test cases that are evaluated using natural language processing to identify relationships of test case elements in accordance with one illustrative embodiment. FIG. 4A illustrates a test case summary for an Oncology Expert Advisor (OEA) Lung Cancer Tumor Lysis Syndrome (TLS) Prediction Regression test case that is used to verify that the TLS prediction for lung patients is working properly in the OEA software product. FIG. 4B illustrates an actual script for a TLS intermediate risk prediction alert generation portion of the OEA lung cancer TLS prediction test case.

As shown in FIG. 4A, given a set of test cases, of which the OEA Lung TLS Prediction Regression test case is one, NLP analysis is performed on the test case to identify all relationships based on the inputs and outputs of the test cases. For example, the test case is read and concepts in the test case are mined from the steps of the test case to create candidate input-output pairs. The NLP analysis may be domain specific such that terms and phrases that are recognized in the test cases may be specific to the particular domain and identified using NLP domain specific resources including domain specific dictionaries, synonym data structures, recognized phrases, and the like. For example, in the illustrative embodiments, the domain may be a "lung cancer" domain, or a more general "cancer" domain with corresponding NLP resources.

In this particular example, the terms "lung" and "prediction" are identified in the title 410 of the test case and in the description of the test case 420. Through analysis of the context of the references to "lung" and "prediction" in the steps of the test case, it can be determined that the input is an identification of whether or not a patient has lung cancer (input: Lung cancer) and the output is a TLS prediction (Output: Prediction). The listing of inputs and outputs may be generated by analyzing the test case as a whole as well as the individual steps of the test case so as to identify all of the potential pairs of inputs/outputs. This provides a first listing of test case element relationships based on analysis of the test cases themselves.

FIG. 4B illustrates an example of a test case script upon which NLP analysis is performed to extract test case element relationships from the inputs/outputs of the test case. As shown in FIG. 4B, the depicted test case script is for a TLS intermediate risk alert generation which may be a portion of the OEA lung cancer TLS prediction test case of FIG. 4A, for example. FIG. 4B illustrates the correlation between phrases and terms specified in the natural language descriptions, expected results, and steps of the test case itself with corresponding test case attributes. For example, the phrase ">18 years old" is recognized as indicative of an age input and the identification of the phrase "Prediction Alert" in the Expected Results in the context of "verifying" such a prediction alert is indicative that the "Prediction Alert of Tumor Lysis Syndrome" is an output.

That is, the example shown in FIG. 4B lists the discrete steps 430 of a test case under the description column. The steps 430 listed under the description column are the "inputs" to the test case. Items 440 under the expected results column are the corresponding "outputs" of the test case. In step 1, the output is the prediction alert. In step 2 of the test case, that prediction alert itself becomes an input. The output of step 2 is that when the user clicks on the timeline link of the prediction alert, a timeline graph is displayed. Thus the prediction alert is the "input" and the timeline graph is the "output" for step 2 of the test case. Thus, for example, the relationships between inputs and outputs may be represented as:

Inputs: Adult, age, Diagnosis, Uric Acid Lab, Potassium Lab, Phosphate Lab, kidney failure toxic event, Prediction Alert Outputs: Prediction Alert, timeline, timeline graph The particular correlation of the relationships for each of FIGS. 4A and 4B may further be represented in a tabular format as:

FIG. 4A:

| Inputs | Outputs |
|---|---|
| Lung cancer, diagnosis = NSCLC, renal problems, Uric acid lab, Potassium lab | Prediction of Intermediate risk of TLS |

FIG. 4B:

| Inputs | Outputs |
|---|---|
| Adult, Age, Diagnosis, Uric Acid Lab, Potassium Lab, Phosphate Lab, kidney failure toxic event | TLS Intermediate Risk Prediction Alert, highlighted link, Lab timeline |
| Mouse left-click, Lab timeline link, Prediction Alert | Timeline graph, Uric Acid Lab, Potassium Lab, Phosphate Lab |

Regarding why the timeline graph is an output compared to any other noun present in the document, such as "screen" or keyboard", the mechanisms of the illustrative embodiments initially scan for entities in the test case and mine for relationships between all the entities found. Searching for entities in general gives a potentially large list of candidate entities. That is why the mechanisms of the illustrative embodiments later run the entities through the corpus looking for supporting evidence to ensure that the entity/relationships actually make sense and are in fact correct entity/relationship correlations.

Figure 5:
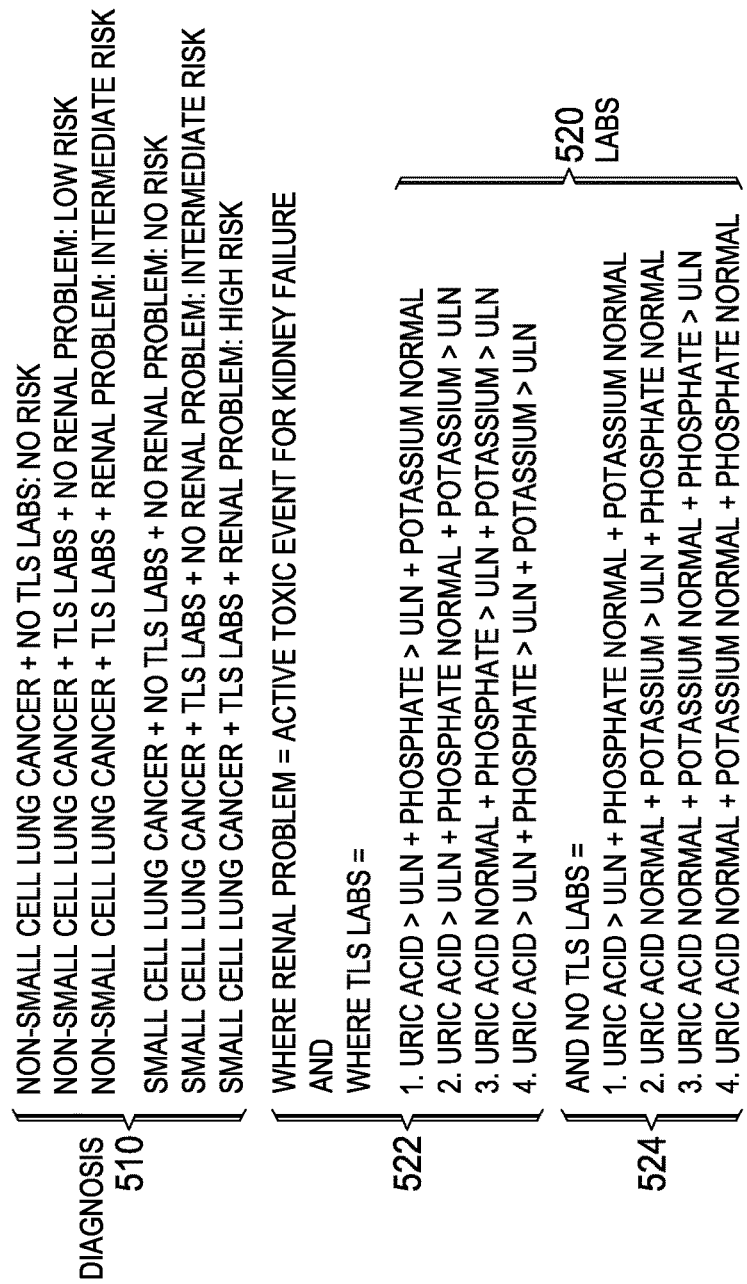
FIG. 5 is an example diagram of a design document that is evaluated using natural language processing to identify relationships of test case elements in accordance with one illustrative embodiment.

FIG. 5 is an example diagram of a design document that is evaluated using natural language processing to identify relationships of test case elements in accordance with one illustrative embodiment. As shown in FIG. 5, the design document 500 comprises a listing of diagnoses 510 and a listing of TLS prediction risks based on lab conditions when a renal problem indicates an active toxic event 520. Thus, for example, when the diagnosis is Non-small cell lung cancer (from Diagnosis 510) and there is a renal problem indicated by an active toxic event for kidney failure, and where the TLS labs meet one of the 4 conditions 522 then the corresponding risk of TLS 510 is Intermediate.

Thus, the design document 500 illustrates the way in which the TLS Predictions software product is intended to operate. From a natural language processing of the design document 500, it can be determined that the inputs to the TLS Prediction are labs and toxic event types, and the output is a TLS risk prediction. Thus, there is a relationship between toxic event types and TLS risk prediction, as well as a relationship between TLS labs and TLS risk prediction which may be modeled in a relationship model in accordance with the illustrative embodiments. Similar to the examples in FIGS. 4A and 4B, various inputs and outputs and their relationships may be identified by performing natural language processing of the content of the design document 500. These relationships may be represented in tabular format as follows, for example:

| Inputs | Outputs |
|---|---|
| Non-small cell lung cancer, Uric Acid Lab, Phosphate Lab, Potassium Lab | Prediction of No risk of TLS |
| Non-small cell lung cancer, Uric Acid Lab, Phosphate Lab, Potassium Lab, no active toxic event | Prediction of Low risk of TLS |
| Non-small cell lung cancer, Uric Acid Lab, Phosphate Lab, Potassium Lab, active toxic event | Prediction of Intermediate risk of TLS |
| small cell lung cancer, Uric Acid Lab, Phosphate Lab, Potassium Lab | Prediction of No risk of TLS |
| small cell lung cancer, Uric Acid Lab, Phosphate Lab, Potassium Lab, no active toxic event | Prediction of Intermediate risk of TLS |
| small cell lung cancer, Uric Acid Lab, Phosphate Lab, Potassium Lab, active toxic event | Prediction of High risk of TLS |

The relationships found through the analysis of the test cases themselves and the domain specific documentation of a domain specific corpus may be scored according to the types of relationships (direct/indirect), the number of instances of the relationship found, and the like. For example, in some illustrative embodiments, relationships found through analysis of the test cases themselves are given a higher score or weight than those found through analysis of design documents or other documentation in a domain specific corpus. The candidate relationships may further be scored by searching the domain specific corpus and/or other related corpora for further evidence in support of the relationship being a valid relationship between elements of a test case, e.g., looking at the number of occurrences of the elements of a candidate relationship within the corpus, looking at the number of occurrences of both elements within close proximity to each other in documents of the corpus, looking at various ratios of the occurrences, e.g., ratio of number of times elements A and B are separately mentioned to the number of times elements A and B are both mentioned in the same portion of text, etc. The resulting scores may be compared to one or more thresholds and the relationships meeting or exceeding the one or more thresholds may be maintained as a subset of relationships that are likely to require re-execution for a particular proposed requirement change.

In the depicted examples of FIGS. 4A, 4B, and 5, candidate relationships of the following type may be identified through the NLP analysis of the test cases and design documentation:

Diagnosis NSCLC or SCLC→prediction (high relevance, design document states diagnosis is a factor in prediction);

Prediction→timeline (high relevance, evidence found in design documents, a timeline displays predictions); and Adult(Age)→prediction (low relevance, this is not mentioned anywhere else than in the test case)

Given these example identified relationships, if a proposed requirements change affects the element "diagnosis" then the TLS Prediction test cases in FIGS. 4A and 4B may need to be re-executed as determined from the first relationship and last relationship above. Thus, this information may be logged, notifications generated, and/or re-execution of the test cases automatically scheduled to be performed.

Figure 6:
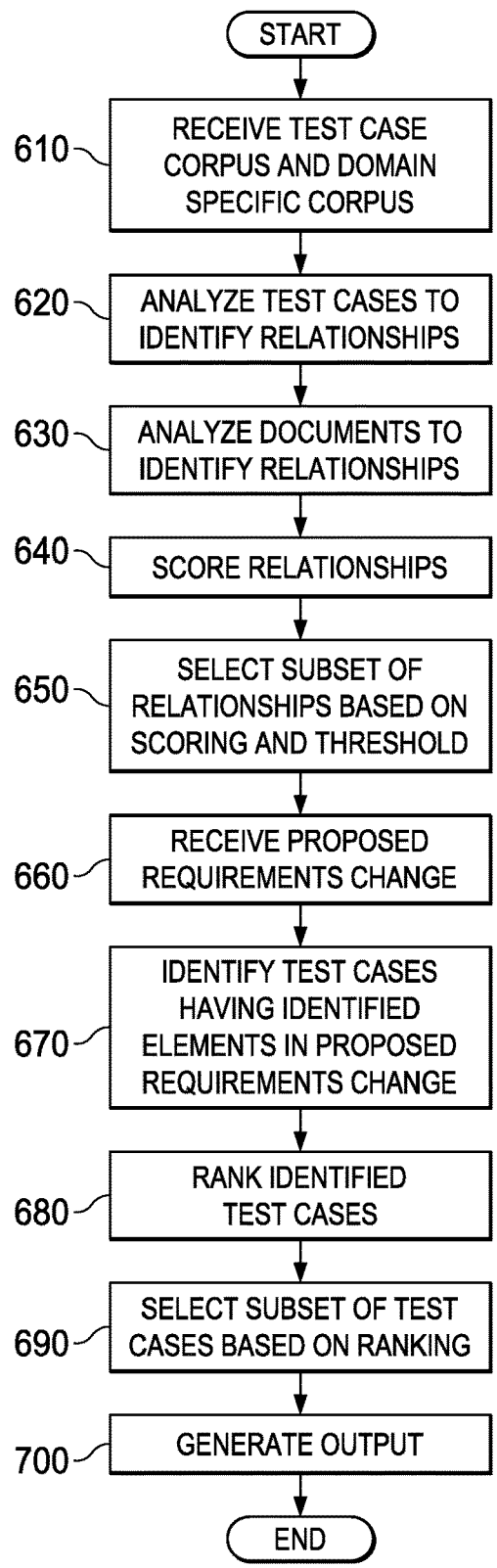
FIG. 6 is a flowchart outlining an example operation of a test case analysis engine in accordance with one illustrative embodiment.

FIG. 6 is a flowchart outlining an example operation of a test case analysis engine in accordance with one illustrative embodiment. The operation outlined in FIG. 6 may be performed, for example, by a test case analysis engine in accordance with one illustrative embodiment, either integrated in, or operating in conjunction with, a QA system pipeline.

The operation starts by receiving a test case corpus and domain specific corpus, where the domain specific corpus comprises electronic documents describing a software product on which the test cases in the test case corpus are executed to test proper operation of the software product (step 610). The test cases in the test case corpus are analyzed using natural language processing (NLP) to identify relationships between inputs and outputs of the test case (step 620). Content of the documents in the domain specific corpus are analyzed using NLP mechanisms to identify additional relationships between elements of test cases (step 630). The resulting candidate set of relationships are scored according to relationship type (direct/indirect), source of the relationship, and/or other evidence scoring from evidence obtained from further NLP based analysis of the test case corpus and domain specific corpus (step 640). The resulting scored candidate relationships are then filtered to select a subset of relationships for further consideration as part of a test case relationship model, e.g., relationships having at least a threshold amount of support that the relationship is a valid relationship (step 650).

A proposed requirements change is received and analyzed to identify which elements of the software product are affected by the proposed requirements change (step 660). Test cases involving the identified elements are identified by searching the test case corpus for the elements based on direct and indirect relationships in the test case relationship model identified in step 650 above (step 670). The resulting listing of test cases is then ranked according to the type of relationship matching the element, e.g., direct/indirect, and the ranking of the relationships that the element is associated with as determined in step 650 above (step 680). A subset of the test cases is selected based on the relative ranking and comparison to one or more threshold rank values, e.g., only test cases having a ranking above 80% are selected (step 690). An output of the selected subset of test cases is then generated and output (step 700) where this output may be a log data structure that logs the identification of the test cases to be re-executed at a later time, a notification message that is output to a client computer of an authorized individual to inform them of the need to re-execute the selected subset of test cases, or an automatic initiation of re-execution of the test cases by a testing system once the proposed requirements change is implemented in the software product. The operation then terminates.

Thus, the mechanisms of the illustrative embodiments utilize natural language processing (NLP) on a test case corpus and domain specific corpus to thereby annotate the test case attributes such that cognitive analysis can be performed to find direct and indirect relationships between system attributes under test and test cases affected when requirements change. The relationships identified in this manner are scored based on an evidence search of one or more corpora with relatively higher scores being provided to relationships found through NLP analysis of the test case corpus. A ranked set of relationships is generated to represent a relationship model of the relationships between elements of the test cases that may be checked when changes to the software code is to be performed. When a change to code of a software product is to be performed, the relationships of the test cases may be searched to identify which test cases will be affected by the proposed change to code. This search may identify direct relationships between an element, or elements, that are subject to the change with elements of one or more test cases based on the relationship model that was generated. The identification of the test cases for re-execution may be performed based on a ranking of the matching test cases according to their dependency relationships.

Although not shown in FIG. 6, as noted above, in some illustrative embodiments, when performing the above operations to identify test cases affected by the proposed change to the code, it is possible that no test cases are identified as having a sufficiently high enough score to warrant re-execution. In such a situation, this lack of identification of a test case for re-execution is indicative of a possible area where a new test case should be generated. In response to the identification of such a situation, a notification may be generated and output to an authorized individual's computing device, or otherwise logged in a log data file for later review and analysis, to inform the authorized individual of the elements affected by the proposed change in the code and an indication of the lack of affect on any test cases being indicative of a need for a new test case.

Moreover, again although not shown in FIG. 6, in still further illustrative embodiments, the mechanisms of the illustrative embodiments may identify test cases that are no longer valid and need to be updated based on requirement changes. For example, if a requirement changes in the code as a result of the proposed changes and/or previously applied changes, then test cases that are over-specified may be identified and a corresponding notification sent to the authorized individual's computing device, or otherwise logged in a log data file for later review and analysis, to inform the authorized individual of the over-specification of the test case and the need to revise or eliminate the test case due to the test case no longer being valid.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments.

The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, in a data processing system comprising a processor and a memory, for evaluating test cases for testing a software product based on a requirements change, the method comprising:
    analyzing, by the data processing system, a test case corpus to identify a plurality of first relationships between elements of test cases in the test case corpus;
    generating, by the data processing system, a test case relationship model based on the identified plurality of first relationships;
    receiving, by the data processing system, a proposed requirements change to change one or more requirements of the software product;
    searching, by the data processing system, the test case relationship model to identify test case relationships corresponding to the proposed requirements change;
    identifying, by the data processing system, a subset of test cases in the test case corpus affected by the proposed requirements change based on the identified test case relationships corresponding to the proposed requirements change at least by generating a ranked listing that ranks each test case having at least one test case relationship corresponding to the proposed requirements change, relative to other test cases having at least one test case relationship, based on whether the at least one test case relationship associated with the test case is a direct relationship or an indirect relationship, whether the test case has multiple test case relationships corresponding to the proposed requirements change, and whether the at least one test case relationship comprises both a direct relationship and an indirect relationship, and selecting test cases from the ranked listing to be the subset of test cases based on relative rankings of the test cases in the ranked listing; and
    generating, by the data processing system, an output specifying the identified subset of test cases.

2. The method of claim 1, wherein searching the test case relationship model to identify test case relationships corresponding to the proposed requirements change comprises identifying direct and indirect relationships between elements of the proposed requirements change and elements of relationships modeled in the test case relationship model.

3. The method of claim 1, wherein analyzing the test case corpus to identify a plurality of first relationships between elements of test cases in the test case corpus, comprises:
    analyzing each test case in the test case corpus to identify correspondence between inputs and outputs of each test case; and
    generating the plurality of first relationships based on the correspondences between inputs and outputs of the test cases in the test case corpus.

4. The method of claim 1, wherein analyzing the test case corpus to identify a plurality of first relationships between elements of test cases in the test case corpus comprises annotating the test cases based on identified test case attributes to facilitate identification of direct and indirect relationships between system attributes under test and test cases affected when system requirements are changed.

5. The method of claim 1, further comprising performing natural language processing of a corpus of documentation referencing the software product to identify one or more second relationships associated with the software product, wherein generating a test case relationship model based on the identified plurality of first relationships further comprises generating the test case relationship model based on both the identified plurality of first relationships and the one or more second relationships.

6. The method of claim 5, wherein generating the test case relationship model based on the identified plurality of first relationships and the one or more second relationships comprises scoring each of the plurality of first relationships and the one or more second relationships based on a search of supporting evidence in the test case corpus and the corpus of documentation for each of the plurality of first relationships and the one or more second relationships.

7. The method of claim 1, wherein generating the output specifying the identified subset of test cases further comprises automatically re-executing test cases in the subset of test cases on the software product and generating an output of the re-executed test cases.

8. The method of claim 1, wherein selecting test cases from the ranked listing to be the subset of test cases comprises:
    comparing each test case's corresponding rank to at least one threshold rank value; and
    selecting test cases from the ranked listing whose corresponding rank meets or exceeds the at least one threshold rank value.

9. The method of claim 8, wherein, in response to the selected test cases comprising a null set of test cases due to no test cases in the ranked listing having corresponding ranks meeting or exceeding the at least one threshold rank value, generating the output specifying the identified subset of test cases further comprises identifying, in the output, a test case to be generated to test the software product with regard to the proposed requirements change.

10. A computer program product comprising a computer readable storage medium having a computer readable program stored therein, wherein the computer readable program, when executed on a data processing system, causes the data processing system to:
    analyze a test case corpus to identify a plurality of first relationships between elements of test cases in the test case corpus;
    generate a test case relationship model based on the identified plurality of first relationships;
    receive a proposed requirements change to change one or more requirements of the software product;
    search the test case relationship model to identify test case relationships corresponding to the proposed requirements change;
    identify a subset of test cases in the test case corpus affected by the proposed requirements change based on the identified test case relationships corresponding to the proposed requirements change at least by generating a ranked listing that ranks each test case having at least one test case relationship corresponding to the proposed requirements change, relative to other test cases having at least one test case relationship, based on whether the at least one test case relationship associated with the test case is a direct relationship or an indirect relationship, whether the test case has multiple test case relationships corresponding to the proposed requirements change, and whether the at least one test case relationship comprises both a direct relationship and an indirect relationship, and selecting test cases from the ranked listing to be the subset of test cases based on relative rankings of the test cases in the ranked listing; and generate an output specifying the identified subset of test cases.

11. The computer program product of claim 10, wherein the computer readable program further causes the data processing system to search the test case relationship model to identify test case relationships corresponding to the proposed requirements change at least by identifying direct and indirect relationships between elements of the proposed requirements change and elements of relationships modeled in the test case relationship model.

12. The computer program product of claim 10, wherein the computer readable program further causes the data processing system to analyze the test case corpus to identify a plurality of first relationships between elements of test cases in the test case corpus, at least by:

analyzing each test case in the test case corpus to identify correspondence between inputs and outputs of each test case; and generating the plurality of first relationships based on the correspondences between inputs and outputs of the test cases in the test case corpus.

13. The computer program product of claim 10, wherein the computer readable program further causes the data processing system to analyze the test case corpus to identify a plurality of first relationships between elements of test cases in the test case corpus at least by annotating the test cases based on identified test case attributes to facilitate identification of direct and indirect relationships between system attributes under test and test cases affected when system requirements are changed.

14. The computer program product of claim 10, wherein the computer readable program further causes the data processing system to perform natural language processing of a corpus of documentation referencing the software product to identify one or more second relationships associated with the software product, wherein the computer readable program further causes the data processing system to generate a test case relationship model based on the identified plurality of first relationships further at least by generating the test case relationship model based on both the identified plurality of first relationships and the one or more second relationships.

15. The computer program product of claim 14, wherein the computer readable program further causes the data processing system to generate the test case relationship model based on the identified plurality of first relationships and the one or more second relationships at least by scoring each of the plurality of first relationships and the one or more second relationships based on a search of supporting evidence in the test case corpus and the corpus of documentation for each of the plurality of first relationships and the one or more second relationships.

16. The computer program product of claim 10, wherein the computer readable program further causes the data processing system to generate the output specifying the identified subset of test cases further at least by automatically re-executing test cases in the subset of test cases on the software product and generating an output of the re-executed test cases.

17. The computer program product of claim 10, wherein the computer readable program further causes the data processing system to select test cases from the ranked listing to be the subset of test cases at least by:

comparing each test case's corresponding rank to at least one threshold rank value; and selecting test cases from the ranked listing whose corresponding rank meets or exceeds the at least one threshold rank value.

18. The computer program product of claim 17, wherein, in response to the selected test cases comprising a null set of test cases due to no test cases in the ranked listing having corresponding ranks meeting or exceeding the at least one threshold rank value, generating the output specifying the identified subset of test cases further comprises identifying, in the output, a test case to be generated to test the software product with regard to the proposed requirements change.

19. An apparatus comprising:

a processor; and a memory coupled to the processor, wherein the memory comprises instructions which, when executed by the processor, cause the processor to:

analyze a test case corpus to identify a plurality of first relationships between elements of test cases in the test case corpus;

generate a test case relationship model based on the identified plurality of first relationships;

receive a proposed requirements change to change one or more requirements of the software product;

search the test case relationship model to identify test case relationships corresponding to the proposed requirements change;

identify a subset of test cases in the test case corpus affected by the proposed requirements change based on the identified test case relationships corresponding to the proposed requirements change at least by generating a ranked listing that ranks each test case having at least one test case relationship corresponding to the proposed requirements change, relative to other test cases having at least one test case relationship, based on whether the at least one test case relationship associated with the test case is a direct relationship or an indirect relationship, whether the test case has multiple test case relationships corresponding to the proposed requirements change, and whether the at least one test case relationship comprises both a direct relationship and an indirect relationship, and selecting test cases from the ranked listing to be the subset of test cases based on relative rankings of the test cases in the ranked listing; and generate an output specifying the identified subset of test cases.

20. The apparatus of claim 19, wherein the instructions further cause the processor to search the test case relationship model to identify test case relationships corresponding to the proposed requirements change at least by identifying direct and indirect relationships between elements of the proposed requirements change and elements of relationships modeled in the test case relationship model.

* * * * *